(12) United States Patent
Bailey et al.

(10) Patent No.: US 6,248,964 B1
(45) Date of Patent: Jun. 19, 2001

(54) THICK FILM ON METAL ENCODER ELEMENT

(75) Inventors: Craig R. Bailey, Mantua, UT (US); Richard E. Riley, Riverside, CA (US); Geary Green, San Diego, CA (US); Stephen J. Waszak, Chula Vista, CA (US)

(73) Assignee: Bourns, Inc., Riverside, CA (US)

( * ) Notice: Subject to any disclaimer, the term of this patent is extended or adjusted under 35 U.S.C. 154(b) by 0 days.

(21) Appl. No.: 09/287,771

(22) Filed: Apr. 7, 1999

Related U.S. Application Data

(63) Continuation-in-part of application No. 09/283,025, filed on Mar. 30, 1999.

(51) Int. Cl.[7] .............................. H01H 1/00; H01H 19/00
(52) U.S. Cl. ...................... 200/11 DA; 29/622; 200/268; 200/269; 200/292
(58) Field of Search .............. 29/622; 200/11 R–11 DA, 200/268, 269, 292

(56) References Cited

U.S. PATENT DOCUMENTS

| Re. 34,484 | 12/1993 | Nagashima et al. | 428/621 |
|---|---|---|---|
| 2,070,321 | 2/1937 | Slezak | 175/366 |
| 3,075,860 | 1/1963 | Veres | 117/211 |
| 3,115,423 | 12/1963 | Ashworth | 117/212 |
| 3,169,892 | 2/1965 | Lemelson | 148/6.3 |
| 3,324,269 | 6/1967 | La Roy | 200/166 |
| 3,622,384 | 11/1971 | Davey et al. | 117/212 |
| 3,926,746 | 12/1975 | Hargis | 204/15 |
| 3,950,586 | 4/1976 | Davey | 428/195 |
| 4,031,272 | 6/1977 | Khanna | 427/96 |
| 4,045,636 * | 8/1977 | Yoder et al. | 200/292 |
| 4,104,421 | 8/1978 | Maher et al. | 427/96 |
| 4,443,670 | 4/1984 | Nakamura et al. | 200/11 DA |
| 4,625,084 | 11/1986 | Fowler et al. | 200/11 DA |
| 4,728,755 | 3/1988 | Fowler et al. | 200/11 DA |
| 4,936,010 | 6/1990 | Suizdak | 29/840 |
| 5,007,159 * | 4/1991 | Brown et al. | 29/622 |
| 5,017,741 | 5/1991 | Brown et al. | 174/260 |
| 5,169,465 | 12/1992 | Riley | 156/89 |
| 5,298,698 * | 3/1994 | Iida et al. | 200/11 DA |
| 5,702,653 | 12/1997 | Riley | 264/61 |
| 5,876,862 * | 3/1999 | Shibuya et al. | 428/672 |

FOREIGN PATENT DOCUMENTS

| 3420524 | 12/1985 | (DE) | H03M/1/22 |

* cited by examiner

Primary Examiner—Michael Friedhofer
(74) Attorney, Agent, or Firm—Klein & Szerkeres, LLP

(57) ABSTRACT

A switching element, specifically an encoder element, is fabricated by forming a conductive track on an insulative substrate, and then screen printing an insulative layer on the track in a predetermined pattern that forms a contact array that comprises a plurality of conductive contacts separated by nonconductive areas. The substrate may be a polymeric resin, and the track comprises (a) a copper base layer formed on a surface of the substrate in the configuration of the track, (b) a first metal-plated layer, preferably of nickel, on the base layer, and (c) a second metal-plated layer, preferably of gold, on the first metal-plated layer. The insulative layer is formed of a thick film dielectric material comprising a difunctional monomer (e.g., diallyl isophthalate), a glycol ether ester (e.g., ethylene glycol monobutyl ether acetate), an inorganic filler (e.g., $BaSO_4$), and an acetate surface modifier (e.g., an ethyl acrylate/ethylhexylacrylate copolymer). The screen-printed dielectric material on the conductive track results in an array of contacts separated by nonconductive areas that extend no more than about 30 microns above the surface of the contacts. An encoder element so fabricated includes first and second concentric annular contact arrays formed that concentrically surround a central collector contact.

29 Claims, 2 Drawing Sheets

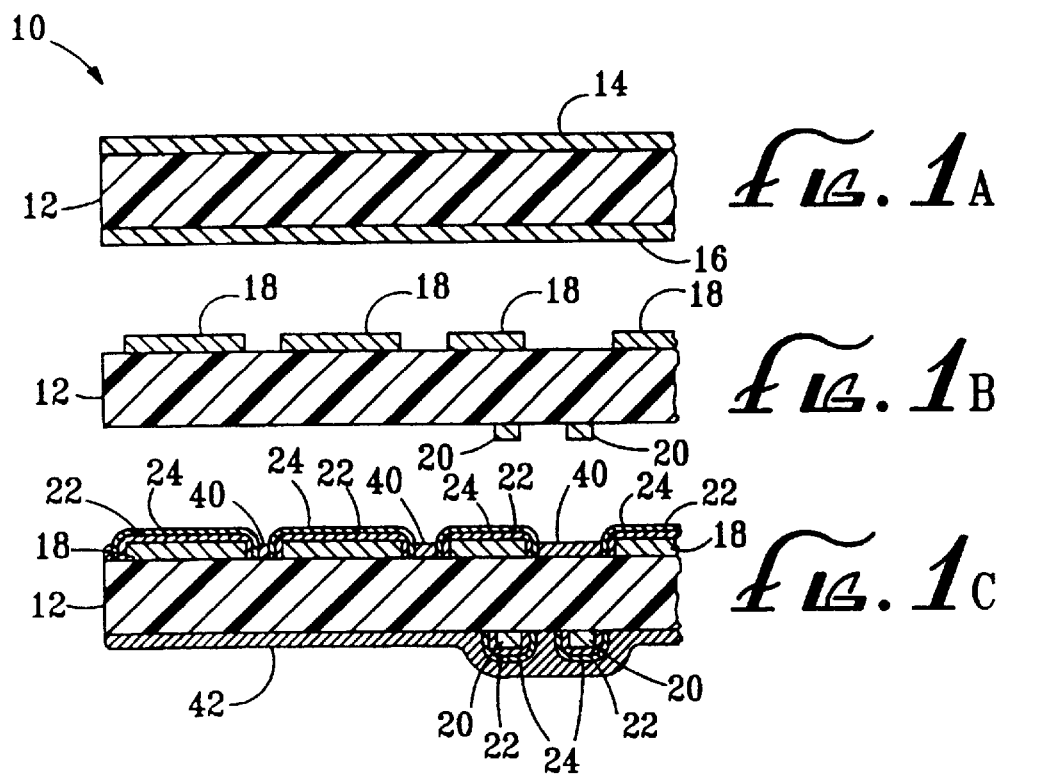
fig. 1A
fig. 1B
fig. 1C
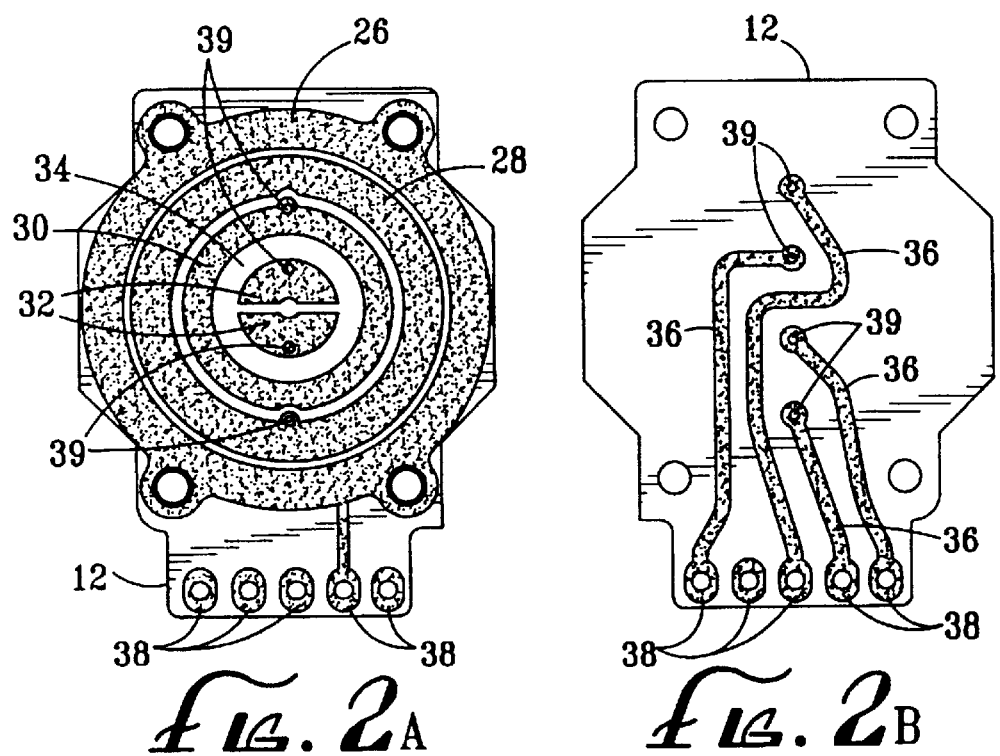
fig. 2A
fig. 2B

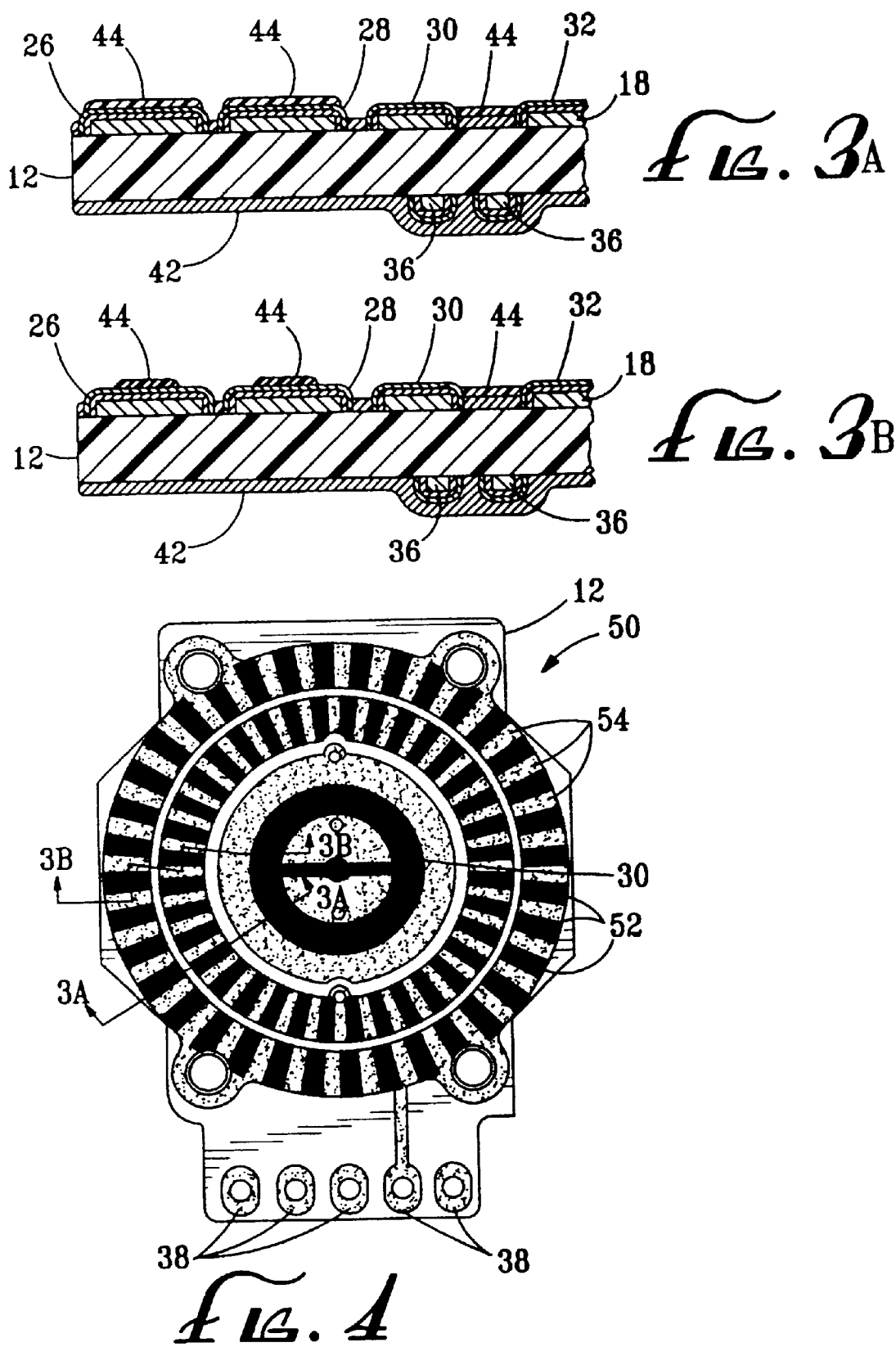

THICK FILM ON METAL ENCODER ELEMENT

CROSS-REFERENCE TO RELATED APPLICATION

This application is a Continuation-in-Part of co-pending application Ser. No. 09/283,025 filed Mar. 30,1999.

FEDERALLY-FUNDED RESEARCH OR DEVELOPMENT

Not Applicable

BACKGROUND OF THE INVENTION

The present invention relates generally to the field of circuit elements that are made with thick film fabrication techniques. More specifically, the invention relates to a thick film switching element that is well-adapted for use as an encoder contact element. The invention also relates to a method of fabricating such an element.

Switching elements in the form of encoder contact elements are commonplace in many electrical and electronic products. A typical prior art encoder contact element comprises a pattern of conductive areas or contacts printed, etched, or deposited on an insulative substrate, usually along a circular or arcuate track, whereby the contacts are sequentially contacted by a conductive wiper so as to produce an encoded electrical signal. For example, the track may comprise alternating conductive contacts and nonconductive areas so as to produce a square wave as the wiper is moved along the track.

There have been many techniques and materials used in the past to fabricate switching elements that are configured for use as encoder contact elements. One technique that has been used is the deposition or printing of thick film conductive inks, such as cermet inks, to form the contacts. This construction produces contacts that are elevated above the surface of the insulative substrate. Consequently, as the wiper passes repeatedly along the encoder track, both the wiper and the contacts are subject to relatively rapid wear, decreasing the lifetime (in terms of rotational cycles) of the encoder. Thus, where durability (long lifetime or a large number of rotational cycles) is desired, thick film cermet inks may not meet performance criteria.

Another technique is described in U.S. Pat. No. 5,702,653-Riley. In the Riley '653 patent, the contacts are formed by fusing a high-temperature glass frit to a non-conductive substrate. A cermet layer having a low temperature glass matrix is applied in the desired encoder pattern to the surface of the frit, and then fired so as to sink into the frit. This results in the cermet forming contacts that are sunk into the frit such that the thickness of the contacts is approximately equal to the original thickness of the frit layer. In actual practice, as described in the '653 patent, the contacts extend above the surface of the frit layer by a distance of about 4 to 10 microns. A similar technique is disclosed in U.S. Pat. No. 5,169,465-Riley.

While the fabrication methods of the aforementioned patents (U.S. Pat. No. 5,702,653 and U.S. Pat. No. 5,169,465) provide improved wear characteristics over conventional thick film fabrication methods, they are limited to encoder devices employing substrate materials that can withstand the relatively high firing temperatures involved (i.e., above the melting point of the glass frit). Thus, while suitable for ceramic and metal substrates, these techniques cannot be used to make encoders that include substrates formed from typical printed circuit ("PC") board materials, such as fiberglass-filled polymeric resins.

Thus, there has been an heretofore unmet need for an encoder element formed on a PC board substrate that provides good wear-resistance with a low contact profile. There has also been a need for method of fabricating such an element.

SUMMARY OF THE INVENTION

Broadly, a first aspect of the present invention is a novel switching element, comprising a polymeric resin substrate, a conductive metal track formed on a first major surface of the substrate, and a thick film dielectric insulator material screen printed on the track in a preselected pattern of nonconductive areas, whereby a desired pattern of conductive contacts is formed by the metal areas left exposed between the nonconductive areas. A preferred embodiment is an encoder comprising two or more annular contact arrays or encoder elements concentrically surrounding a central collector contact in a "bull's-eye" pattern. Each of the encoder elements and the collector contact comprises a copper base layer of about 25 to 40 microns in thickness, which is plated first with a nickel layer of a thickness of approximately 1 to 2 microns, and then a gold layer of a thickness of at least about 0.25 microns. The insulative material is, in the preferred embodiment, a mixture of a difunctional monomer (e.g., diallyl isophthalate), a glycol ether ester (e.g., diethylene glycol monobutyl ether acetate), an inorganic filler (e.g., $BaSO_4$), and an acetate surface modifier (e.g., an ethyl acrylate/ethylhexylacrylate copolymer), with a small amount of organic pigment. The insulator material is preferably applied to a thickness of about 10 to 30 microns.

Conductive traces are formed on the opposite major surface of the substrate to provide the necessary electrical connections between the conductive elements on the first major surface and terminal pins that are installed in the substrate for installation into an electrical circuit. Each of the traces comprises a copper base layer plated with nickel and gold in the aforementioned thicknesses.

In another aspect, the present invention is a method of fabricating a switching element, comprising, in the preferred embodiment, the steps of:

(1) Providing a substrate comprising a layer of fiberglass-filled polymeric resin sandwiched between first and second copper layers, each of which is approximately 25 to 40 microns thick;

(2) Using conventional PC board fabrication techniques, (a) forming the first copper layer into a central collector contact base layer and at least one conductive track base layer concentrically surrounding the collector contact base layer, and (b) forming the second copper layer into a plurality of conductive trace base layers;

(3) Plating the collector contact base layer, the conductive track base layer or layers, and the conductive trace base layers with a first plating layer of nickel and with a second plating layer of gold, to form a central collector contact, at least one conductive track, and a plurality of conductive traces; and (4) Screen printing a thick film insulative material onto the conductive track or tracks in a preselected pattern of insulative areas, whereby a desired pattern of conductive contacts is formed by the metal areas left exposed between the insulative areas.

In the preferred embodiment, the materials and thicknesses are as described above.

As will be better appreciated from the detailed description that follows, the present invention provides a wear-resistant, low profile contact pattern that is specifically well-suited for fabrication on PC board material. The resulting contacts are particularly useful in encoder applications, because of the extended lifetime that can be obtained. It will be readily understood, however, that the novel concept of forming a pattern of conductive contacts by screen printing a pattern of thick film insulative material onto a conductive metal track or layer can be applied to a wide variety of switching devices, and is not limited to encoders.

BRIEF DESCRIPTION OF THE DRAWINGS

FIGS. 1A, 1B, and 1C are cross-sectional views of a section of PC board, showing the steps of creating the conductive areas of a switching element, such as an encoder element;

FIG. 2A is a plan view of a first major surface of a PC board on which the conductive tracks and central collector contact of en encoder element have been formed;

FIG. 2B is a plan view of a second major surface of the PC board of FIG. 2A, showing the conductive traces of an encoder element;

FIGS. 3A and 3B are cross-sectional views, taken along lines 3A—3A, 3B—3B, respectively, of FIG. 4, showing the application of a dielectric insulative material to selected areas of the conductive tracks of the encoder element; and FIG. 4 is a plan view of the first major surface of the PC board of FIG. 2A after the application of the dielectric insulative material to selected areas of the conductive tracks so as to form an encoder element.

DETAILED DESCRIPTION OF THE INVENTION

Referring now to the drawings, FIGS. 1A, 1B, and 1C illustrate the steps in the fabrication of a PC board having a pattern of conductive areas as required for a switch element, such as an encoder element. FIG. 1A shows a section of PC board blank 10, comprising a polymeric layer 12 sandwiched between a first or upper metal foil layer 14 and a second or lower metal foil layer 16. The blank 10 is of conventional manufacture, and may be made of any of the materials that are commonly used in the fabrication of PC boards. For example, the polymeric layer 12 is preferably a fiber-filled epoxy resin, wherein the fibers are preferably fiberglass, but they also may be linen or cellulose (i.e., paper). The foil layers 14, 16 are typically copper foil, bonded to the polymeric layer 12 by methods well known in the PC board fabrication art. The foil layers 14, 16 may typically be about 25 to 40 microns thick.

The blank 10 is then masked and photo-etched, using standard PC board fabrication techniques, to create a pattern of conductive track base layers 18 on a first major surface of the blank 10, and a pattern of conductive trace base layers 20 on the opposite (second) major surface. The conductive base layers 18, 20 are then metal-plated, using conventional metal plating techniques, with a first metal-plated layer 22, preferably of nickel, and then a second metal-plated layer 24, preferably of gold. The nickel layer 22 may be about 1 to 5 microns thick, and preferably about 1 to 2 microns thick. The gold layer 24 is preferably at least about 0.25 microns thick. Instead of gold, the second metal-plated layer 24 may be made of gold-cobalt, tin, silver, palladium, palladium-cobalt, or any other pure or alloyed metal known in the electronic component industry for the fabrication of electrical contact surfaces.

As shown in FIGS. 1C and 2A, the metal-plated copper areas on the first major surface of the PC board form a "bull's-eye" array of concentric annular conductive tracks on the first major surface of the PC board: a first or outer conductive track 26, a second or middle conductive track 28, and a third or inner conductive track 30. A pair of switch contacts 32 may optionally be formed in the center of the conductive track array for certain applications. These contacts 32, which are separated from the inner conductive track 30 by an annular area 34, are likewise formed of the copper foil 14 plated with the nickel layer 22 and the gold layer 24.

As shown in FIGS. 1C and 2B, the metal-plated copper areas on the second major surface of the PC board form a pattern of conductive traces 36 that will provide electrical connections between the conductive elements 26, 28, 30, and 32 and their respective terminals 38 near an edge of the PC board. The traces 36, in turn, are electrically connected to the respective conductive elements on the first major surface of the PC board by means of metallized vias 39. The terminals 38 are apertured for the installation of termination pins (not shown) that facilitate the installation of the device into an electrical circuit (not shown).

A layer 40 of conventional solder mask material is advantageously applied, as is well-known in the PC board fabrication art, between and around the conductive tracks 26, 28, 30, and 32 on the first major surface. The application of the solder mask layer 40 to the annular area 34 is optional. A similar solder mask layer 42 is applied over the entire second major surface, including the traces 36, excluding only the areas of the terminals 38. (For the sake of clarity, however, the solder mask layer is shown only in FIG. 1C, but not in FIGS. 2A and 2B.)

Referring now to FIGS. 3A, 3B, and 4, the step of applying a thick film insulative layer 44 is shown. The insulative layer 44 comprises a thick film dielectric material, applied by conventional screen-printing techniques (or any other suitable method) in a preselected pattern on the first conductive track 26 and the second conductive track 28, which become, respectively, first and second encoder tracks, each comprising an array of conductive contacts separated by nonconductive areas. The insulative layer may optionally be applied to the annular area 34 between the third conductive track 30 and the switch contacts 32. The insulative layer 44 is applied to the encoder tracks 26, 28 in a pattern that is selected to provide a predetermined output signal as a wiper (not shown) passes along the tracks. In the specific example of a finished encoder element 50 illustrated in FIG. 4, for example, the pattern provides nonconductive areas 52 (where the dielectric layer 44 is applied) alternating with conductive areas that form contacts 54 (where the dielectric layer 44 is not applied), resulting in a square wave output signal for each of the first and second encoder tracks 26, 28. In the illustrated pattern, the alternating nonconductive areas 52 and contacts 54 in each of the encoder tracks 26, are all of approximately the same circumferential width, thereby yielding square wave output signals of regular periodicity. Other patterns, however, can be used to yield output signals with other waveform shapes.

The third conductive track 30 has no insulative material applied to it, and thus functions as a central collector contact.

The material of the insulative layer 44 can be selected from a number of insulative materials that are adapted for thick film screen printing. A preferred material is a mixture of a difunctional monomer (such as diallyl isophthalate), a glycol ether ester (such as ethylene glycol monobutyl ether acetate), an inorganic filler (such as barium sulfate), and an acetate surface modifier (preferably an ethyl acrylate/ethylhexylacrylate copolymer), with, optionally, a small amount of organic pigment. The material is preferably applied to a thickness of about 10 to 30 microns. Preferred mixtures will have the following compositional proportions, by weight:

| Diallyl isophthalate | 38%–48% (most preferably 48%) |
| --- | --- |
| Ethylene glycol monobutyl ether acetate | 32%–42% (most preferably 32%) |
| Barium sulfate | 11%–25% (most preferably 18%) |
| Acetate surface modifier | Up to 5% (most preferably 1%) |
| Organic pigment | Up to 5% (most preferably 1%) |

From the foregoing description, it can be seen that the nonconductive areas 52 are of relatively low vertical profile relative to the intervening contacts 54. Specifically, the nonconductive areas 52 have a vertical height of about 10 to 30 microns above the surface of the contacts. This low profile, coupled with the rounded edges for the nonconductive areas 52 resulting from the screen printing process, results in an extended lifetime for the encoder element 50 and for the wiper (not shown) used with it. For example, prototypes of the present invention, constructed in accordance with the above-described preferred embodiment, have exceeded 150,000 rotational cycles.

An encoder element constructed in accordance with either the preferred or the alternative embodiment described above is durable, wear-resistant, environmentally stable, and nonabrasive (to the wiper), while exhibiting low contact resistance. As mentioned above, a reasonably long lifetime of up to about 150,000 cycles can be achieved. Furthermore, because the present invention allows high-lifetime encoder elements to be fabricated on inexpensive PC boards, using low-cost screen printing techniques, these advantages are achieved in an encoder element that can be manufactured at a fraction of the cost of prior art high-lifetime encoder elements.

While a preferred embodiment and an alternative embodiment have been described above, it will be appreciated that a number of variations and modifications may suggest themselves. For example, the encoder element may be made with only a single encoder track, or three or more encoder tracks, depending on the application. The configuration of the encoder track or tracks, and/or of the central collector contact, may also be altered to suit any of a variety of applications. Furthermore, the materials mentioned herein for the conductive elements and the dielectric layer are suggestive only, and other suitable materials will suggest themselves to those skilled in the pertinent arts. In addition, it will be appreciated that the inventive concept of a screen-printed thick film dielectric material applied to an underlying conductive element in a predetermined pattern to form a pattern of contacts separated by nonconductive areas can be applied to a wide variety of switching devices. Thus, while the present invention has been described in the context of an encoder element as a particularly advantageous application, the present invention is not limited to encoder elements. Moreover, while an embodiment of the invention employing a PC board substrate has been specifically disclosed, the invention can be readily adapted to ceramic metal substrates used, although in the latter case an insulative underlayer must be applied to the surface prior to formation of the conductive tracks and traces. These and other modifications and variations that may suggest themselves are considered to be within the spirit and scope of the invention, as defined in the claims that follow.

What is claimed is:

1. A switching element, comprising:
    an insulative substrate;
    a conductive track formed on the substrate; and
    a layer of insulative material screen-printed on the conductive track in a preselected pattern so as to form a plurality switch contacts separated by nonconductive areas that extend above the switch contacts by a height of no more than about 30 microns.

2. The switching element of claim 1, wherein the substrate is made of a polymeric material, and wherein the conductive track includes a metal base layer and at least one metal-plated layer on the base layer.

3. The switching element of claim 2, wherein the base layer consists essentially of copper, and wherein the conductive track further comprises a first metal-plated layer on the base layer, and a second metal-plated layer on the first metal-plated layer.

4. The switching element of claim 3, wherein the first metal-plated layer consists essentially of nickel, and wherein the second metal-plated layer consists essentially of a metal selected from the group consisting of gold, gold-cobalt alloy, silver, tin, palladium, and palladium-cobalt alloy.

5. The switching element of any of claims 2, 3, or 4, wherein the insulative material includes a difunctional monomer and a glycol ether ester.

6. The switching element of claim 5, wherein the difunctional monomer is diallyl isophthalate.

7. An encoder element, comprising:
    an insulative substrate;
    a conductive track formed on the substrate;
    a collector contact formed on the substrate;
    a pattern of nonconductive areas screen-printed on the conductive track so as to form a plurality of encoder contacts in a predetermined encoder pattern, the contacts being separated by the nonconductive areas, wherein the nonconductive areas extend above the encoder contacts by a height of not more than about 30 microns.

8. The encoder element of claim 7, wherein the substrate is made of a polymeric material, and wherein the conductive track and the collector contact include a metal base layer and at least one metal-plated layer on the base layer.

9. The encoder element of claim 8, wherein the base layer consists essentially of copper, and wherein the conductive track and the collector contact further comprise a first metal-plated layer on the base layer, and a second metal-plated layer on the first metal-plated layer.

10. The encoder element of claim 9, wherein the first metal-plated layer consists essentially of nickel, and wherein the second metal-plated layer consists essentially of a metal selected from the group consisting of gold, gold-cobalt alloy, silver, tin, palladium, and palladium-cobalt alloy.

11. The encoder element of any of claims 8, 9, or 10, wherein the nonconductive material includes a difunctional monomer and a glycol ether ester.

12. The encoder element of claim 11, wherein the difunctional monomer is diallyl isophthalate.

13. A method of fabricating a switching element, comprising the steps of:
    (a) providing a printed circuit board with a copper base layer formed on one surface thereof in a configuration of a conductive track to be formed thereon;
    (b) metal-plating the copper base layer to form the conductive track; and
    (c) screen-printing an insulative thick film layer on the conductive track in a predetermined pattern to form a plurality of switch contacts separated by insulative areas that extend above the switch contacts by a height of no more than about 30 microns.

14. The method of claim 13, wherein the metal-plating step comprises the steps of:
   (b)(1) plating the base layer with a first metal-plated layer; and
   (b)(2) plating the base layer with a second metal-plated layer.

15. The method of claim 14, wherein the first metal-plated layer consists essentially of nickel.

16. The method of either of claims 14 or 15, wherein the second metal plated layer consists essentially of a metal selected from the group consisting of gold, gold-cobalt alloy, tin, silver, palladium, and palladium-cobalt alloy.

17. The method of claim 16, wherein the second metal-plated layer consists essentially of gold.

18. The method of claim 17, wherein the insulative layer is formed of a material that includes a difunctional monomer and a glycol ether ester.

19. The method of claim 18, wherein the difunctional monomer is diallyl isophthalate.

20. The method of claim 16, wherein the insulative layer is formed of a material that includes a difunctional monomer and a glycol ether ester.

21. The method of claim 20, wherein the difunctional monomer is diallyl isophthalate.

22. The method of any of claims 13, 14, or 15, wherein the insulative layer is made of a material that includes a difunctional monomer and a glycol ether ester.

23. The method of claim 22, wherein the difunctional monomer is diallyl isophthalate.

24. A method of fabricating a switching element, comprising the steps of:
   (a) providing a printed circuit board with a copper base layer formed on one surface thereof in a configuration of a conductive track to be formed thereon;
   (b) metal-plating the copper base layer to form the conductive track; and
   (c) screen-printing an insulative thick film layer on the conductive track in a predetermined pattern to form a plurality of switch contacts separated by insulative areas, wherein the insulative layer is made of a material that includes a difunctional monomer and a glycol ether ester.

25. The method of claim 24, wherein the metal-plating step comprises the steps of:
   (b)(1) plating the base layer with a first metal-plated layer; and
   (b)(2) plating the base layer with a second metal-plated layer.

26. The method of claim 25, wherein the first metal-plated layer consists essentially of nickel.

27. The method of either of claims 25 or 26, wherein the second metal plated layer consists essentially of a metal selected from the group consisting of gold, gold-cobalt alloy, tin, silver, palladium, and palladium-cobalt alloy.

28. The method of claim 27, wherein the second metal-plated layer consists essentially of gold.

29. The method of claim 24, wherein the difunctional monomer is diallyl isophthalate.

* * * * *